US009054404B2

(12) United States Patent
Wang

(10) Patent No.: US 9,054,404 B2
(45) Date of Patent: Jun. 9, 2015

(54) MULTI-LAYER CIRCUIT BOARD WITH WAVEGUIDE TO MICROSTRIP TRANSITION STRUCTURE

(71) Applicant: MICROELECTRONICS TECHNOLOGY, INC., Hsinchu (TW)

(72) Inventor: Chung Jui Wang, Hsinchu (TW)

(73) Assignee: Microelectronics Technology, Inc., Hsinchu (TW)

( * ) Notice: Subject to any disclaimer, the term of this patent is extended or adjusted under 35 U.S.C. 154(b) by 45 days.

(21) Appl. No.: 13/975,872

(22) Filed: Aug. 26, 2013

(65) Prior Publication Data

US 2015/0054593 A1 Feb. 26, 2015

(51) Int. Cl.
*H03H 5/00* (2006.01)
*H01P 5/08* (2006.01)

(52) U.S. Cl.
CPC .................................... *H01P 5/087* (2013.01)

(58) Field of Classification Search
USPC ............ 333/24 R, 25, 26, 204, 208, 238, 239
See application file for complete search history.

(56) References Cited

U.S. PATENT DOCUMENTS 4,716,386 A * 12/1987 Lait ................................ 333/26
5,982,250 A * 11/1999 Hung et al. ..................... 333/26
7,196,274 B2 * 3/2007 Cooper et al. ................ 174/255
8,680,936 B2 * 3/2014 Purden et al. .................. 333/26
8,901,719 B2 * 12/2014 Ligander ....................... 257/664
2007/0052504 A1 * 3/2007 Fujita ............................ 333/238
2012/0188030 A1 7/2012 Liu et al.
2012/0256707 A1 10/2012 Leiba et al.

FOREIGN PATENT DOCUMENTS

EP 0249310 12/1987
JP 2007-013450 1/2007
JP 2011-120155 6/2011

* cited by examiner

*Primary Examiner* — William Hernandez
(74) *Attorney, Agent, or Firm* — Hamre, Schumann, Mueller & Larson, P.C.

(57) ABSTRACT

A multi-layer circuit board with a waveguide to microstrip transition structure includes a laminated structure having a plurality of dielectric layers, a top metal frame disposed over the laminated structure, a microstrip line disposed over the laminated structure, a bottom metal frame underlying the laminated structure, and a plurality of conductors electrically connecting the top metal frame and the bottom metal frame. The top metal frame defines a top cavity, the bottom metal frame defines a bottom cavity corresponding to the top cavity, and the microstrip line extends into the top cavity. The laminated structure includes an upper dielectric layer and at least one lower dielectric layer, wherein top cavity exposes a top surface of the upper dielectric layer, and the bottom cavity exposes a bottom surface of the at least one lower dielectric layer.

19 Claims, 18 Drawing Sheets

MULTI-LAYER CIRCUIT BOARD WITH WAVEGUIDE TO MICROSTRIP TRANSITION STRUCTURE

TECHNICAL FIELD

The present disclosure relates to a multi-layer circuit board, and more particularly, to a multi-layer circuit board with a waveguide to microstrip transition structure.

DISCUSSION OF THE BACKGROUND

Microwave and millimeter wave circuits may use a combination of rectangular and/or circular waveguides and planar transmission lines such as striplines, microstrips, and coplanar waveguides. Waveguides are commonly used, for example, in antenna feed networks. Microwave circuit modules typically use microstrip transmission lines to interconnect microwave integrated circuits and semiconductor devices mounted on planar substrates. Transition devices are used to couple signals between microstrip transmission lines and waveguides.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides a multi-layer circuit board with a waveguide to microstrip transition structure.

According to some embodiments of the present disclosure, a multi-layer circuit board with a waveguide to microstrip transition structure comprises a laminated structure including a plurality of dielectric layers, a top metal frame disposed over the laminated structure, a microstrip line disposed over the laminated structure, a bottom metal frame underlying the laminated structure, and a plurality of conductors electrically connecting the top metal frame and the bottom metal frame. In some embodiments of the present disclosure, the top metal frame defines a top cavity, the bottom metal frame defines a bottom cavity corresponding to the top cavity, and the microstrip line extends into the top cavity. In an exemplary embodiment of the present disclosure, the laminated structure includes an upper dielectric layer and at least one lower dielectric layer, wherein the top cavity exposes a top surface of the upper dielectric layer, and the bottom cavity exposes a bottom surface of the at least one lower dielectric layer.

According to another embodiment of the present disclosure, a multi-layer circuit board with a waveguide to microstrip transition structure comprises a laminated structure including a plurality of dielectric layers, a top metal frame disposed over the laminated structure, a microstrip line disposed over the laminated structure, a bottom metal frame underlying the laminated structure, and a plurality of conductors electrically connecting the top metal frame and the bottom metal frame. In some embodiments of the present disclosure, the laminated structure has a waveguide cavity and a protrusion extending into the waveguide cavity, wherein the waveguide cavity penetrates through the laminated structure, and the microstrip line is disposed over the protrusion and extends into the waveguide cavity. In an exemplary embodiment of the present disclosure, the laminated structure includes an upper dielectric layer and at least one lower dielectric layer, wherein the waveguide cavity exposes a top surface of the upper dielectric layer of the protrusion and a bottom surface of the lower dielectric layer of the protrusion.

According to another embodiment of the present disclosure, a multi-layer circuit board with a waveguide to microstrip transition structure comprises a laminated structure including a plurality of dielectric layers, a top metal frame disposed over the laminated structure, a microstrip line disposed over the laminated structure, a bottom metal frame underlying the laminated structure, wherein the bottom metal frame defines a bottom cavity corresponding to the top cavity, and a plurality of conductors electrically connecting the top metal frame and the bottom metal frame. In some embodiments of the present disclosure, the top metal frame defines a top cavity, the bottom metal frame defines a bottom cavity corresponding to the top cavity, and the microstrip line is disposed over the laminated structure and extends into the top cavity. In an exemplary embodiment of the present disclosure, the laminated structure includes an upper dielectric layer and at least one lower dielectric layer, wherein the bottom cavity extends into the at least one lower dielectric layer and exposes a bottom surface of the upper dielectric layer.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "some embodiments," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a multi-layer circuit board with a waveguide to microstrip transition structure. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
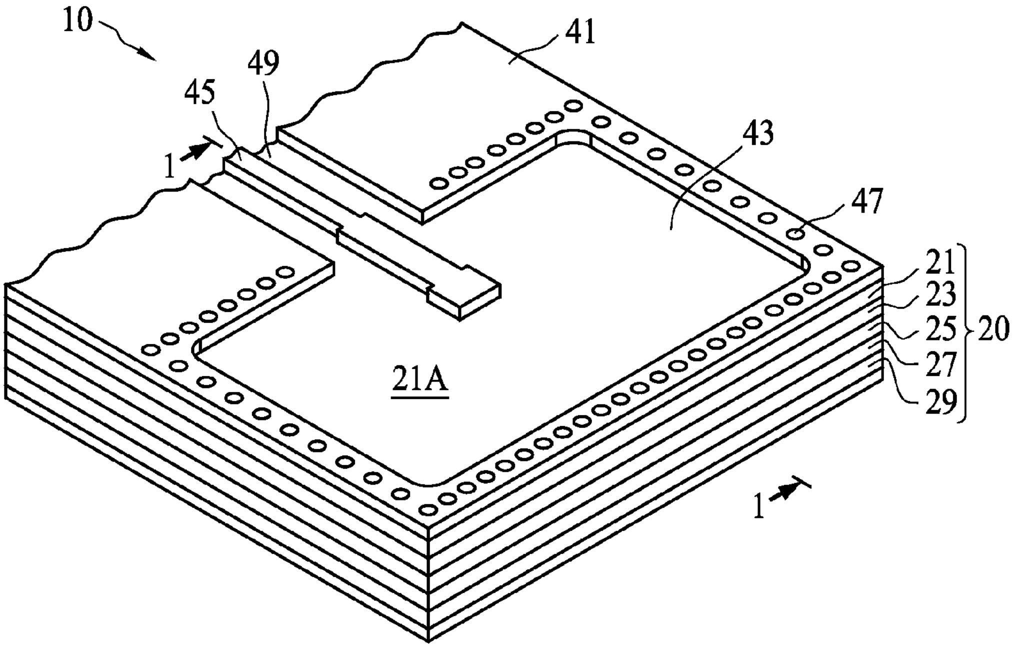
FIG. 1 is a top full view of a multi-layer circuit board with a waveguide to microstrip transition structure according to some embodiments of the present disclosure.
Figure 2:
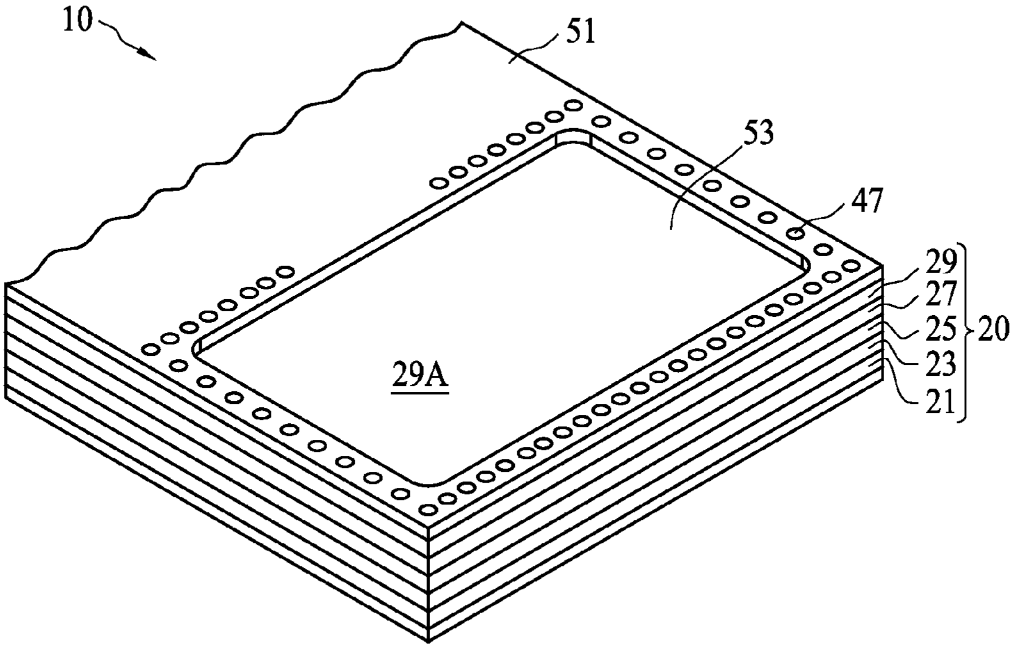
FIG. 2 is a bottom full view of the multi-layer circuit board in FIG. 1.

FIG. 1 is a top full view of a multi-layer circuit board 10 with a waveguide to microstrip transition structure according to some embodiments of the present disclosure, and FIG. 2 is a bottom full view of the multi-layer circuit board 10 in FIG. 1. In some embodiments of the present disclosure, the multi-layer circuit board 10 comprises a laminated structure 20 including a plurality of dielectric layers 21-29, a top metal frame 41 disposed over the laminated structure 20, a microstrip line 45 disposed over the laminated structure 20, a bottom metal frame 51 underlying the laminated structure 20, and a plurality of conductors 47 electrically connecting the top metal frame 41 and the bottom metal frame 51.

In some embodiments of the present disclosure, the top metal frame 41 defines a top cavity 43, the bottom metal frame 51 defines a bottom cavity 53 corresponding to the top cavity 43, and the microstrip line 45 extends into the top cavity 43. In some embodiments of the present disclosure, the top metal frame 41 has a passage gap 49, and the microstrip line 45 extends into the top cavity 43 through the passage gap 49. In some embodiments of the present disclosure, the conductors 47 are conductive through holes which are either plated or filled with conductive material such as copper or copper alloy; in addition, other conductive material can also be used to form the conductors 47.

In an exemplary embodiment of the present disclosure, the top metal frame 41 and the bottom metal frame 51 may be formed of copper or copper alloy; in addition, other conductive material can also be used to form the top metal frame 41 and the bottom metal frame 51. In an exemplary embodiment of the present disclosure, the top metal frame 41 and the bottom metal frame 51 may have a thickness of 17.5 micrometers, which is commonly referred to as 0.5 oz copper.

In some embodiments of the present disclosure, the laminated structure 20 includes an upper dielectric layer 21 and a lower dielectric layer 29, wherein the upper dielectric layer 21 has a first dissipation factor, the lower dielectric layer 29 has a second dissipation factor, and the first dissipation factor is smaller than the second dissipation factor. For example, the upper dielectric layer 21 may use an RO4003C™ dielectric having a dissipation factor of 0.0027, which is commercially available from Rogers Corporation, or a TLY-5 dielectric having a dissipation factor of 0.0009, which is commercially available from Taconic International, Ltd, and the lower dielectric layer 29 may use epoxy-glass composite (FR4) material having a dissipation factor of 0.017. In a preferred embodiment of the present disclosure, the upper dielectric layer 21 is implemented by the RO4003C™ dielectric, and is considered inexpensive as compared to the TLY-5 dielectric.

In some embodiments of the present disclosure, the top cavity 43 exposes a top surface 21A of the upper dielectric layer 21, and the bottom cavity 53 exposes a bottom surface 29A of the lower dielectric layer 29. In an exemplary embodiment of the present disclosure, the upper dielectric layer 21 can be implemented by a sheet of an RO4003C™ dielectric having a thickness of 8.0 mil, and the lower dielectric layers 23-29 can be implemented by sheets of epoxy-glass composite (FR4) material having thicknesses from 4.7 mil to 8.0 mil.

Figure 3:
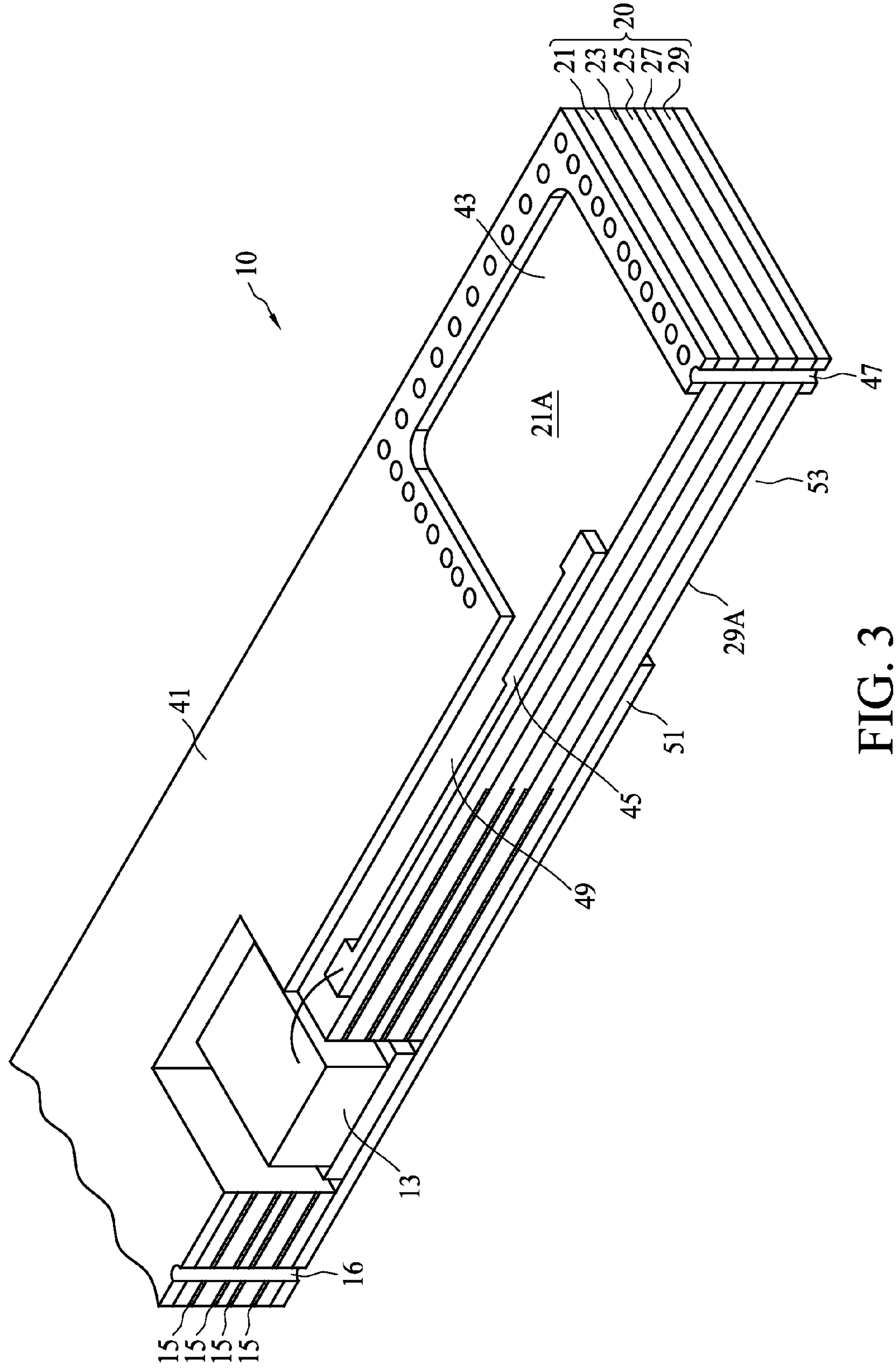
FIG. 3 is a distant cross-sectional view of the multi-layer circuit board along the cross-sectional line 1-1 in FIG. 1.

FIG. 3 is a distant cross-sectional view of the multi-layer circuit board 10 along the cross-sectional line 1-1 in FIG. 1, showing the other portion of the multi-layer circuit board 10. In some embodiments of the present disclosure, the multi-layer circuit board 10 further comprises a plurality of metal layers 15 disposed between two of the plurality of dielectric layers 21-29. In an exemplary embodiment of the present disclosure, the metal layers 15 are electrically connected through conductors 16 such as conductive through holes which are either plated or filled with conductive material.

In some embodiments of the present disclosure, the multi-layer circuit board 10 further comprises an electronic device 13 electrically connected to the microstrip line 45 or at least one of the metal layers 15. In an exemplary embodiment of the present disclosure, the electronic device 13 is an RF signal processing circuit, a power amplifier, or a filter. In addition, the electronic device 13 may electrically connect to another device (not shown in the drawings) disposed on the multi-layer circuit board 10 through the metal layers 15 and the conductive members 16. In an exemplary embodiment of the present disclosure, the metal layers 15 may have a thickness of 17.5 micrometers (commonly referred to as 0.5 oz copper) or a thickness of 35.0 micrometers (commonly referred to as 1.0 oz copper).

Figure 4:
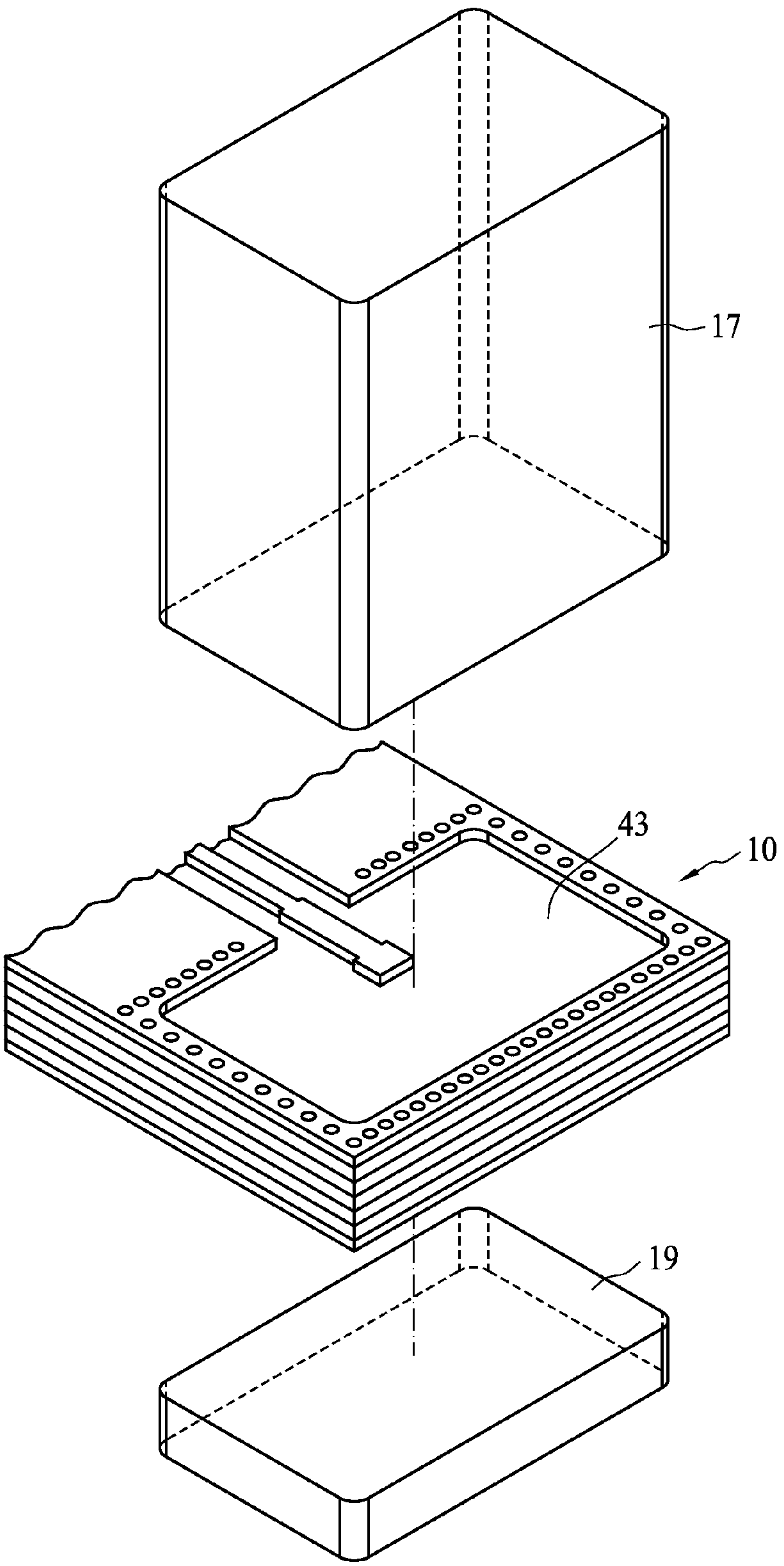
FIG. 4 is an exploded view of the multi-layer circuit board in FIG. 1 with other components.

FIG. 4 is an exploded view of the multi-layer circuit board 10 in FIG. 1 with other components. In some embodiments of the present disclosure, the multi-layer circuit board 10 may be assembled with a waveguide 17 coupled to the top cavity 43 and a wave reflector 19 coupled to the bottom cavity 53. In an exemplary embodiment of the present disclosure, the waveguide 17 may use a WR-62 waveguide.

Figure 5:
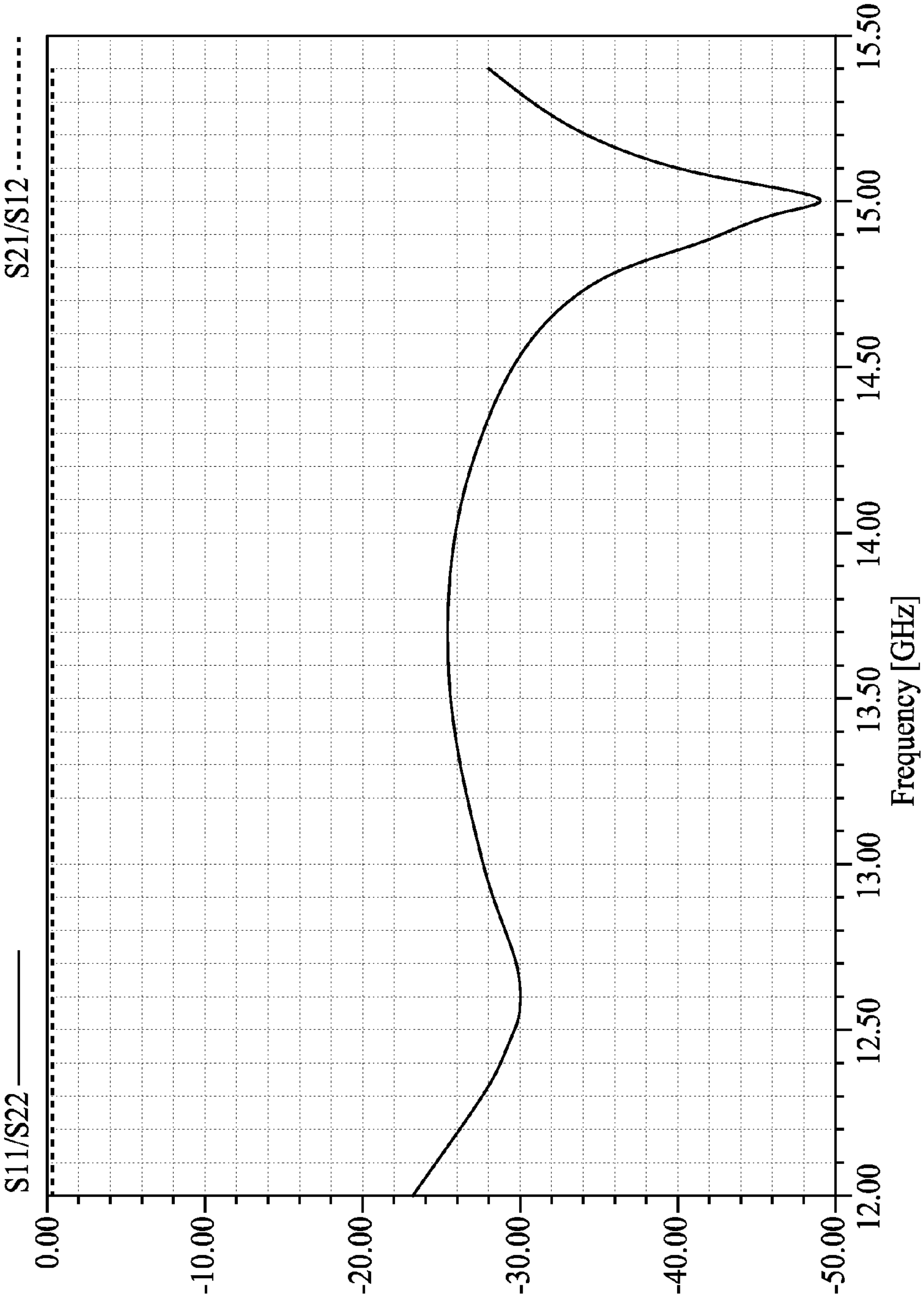
FIG. 5 is a simulated frequency response diagram of the multi-layer circuit board with a waveguide to microstrip transition structure in FIG. 1.
Figure 6:
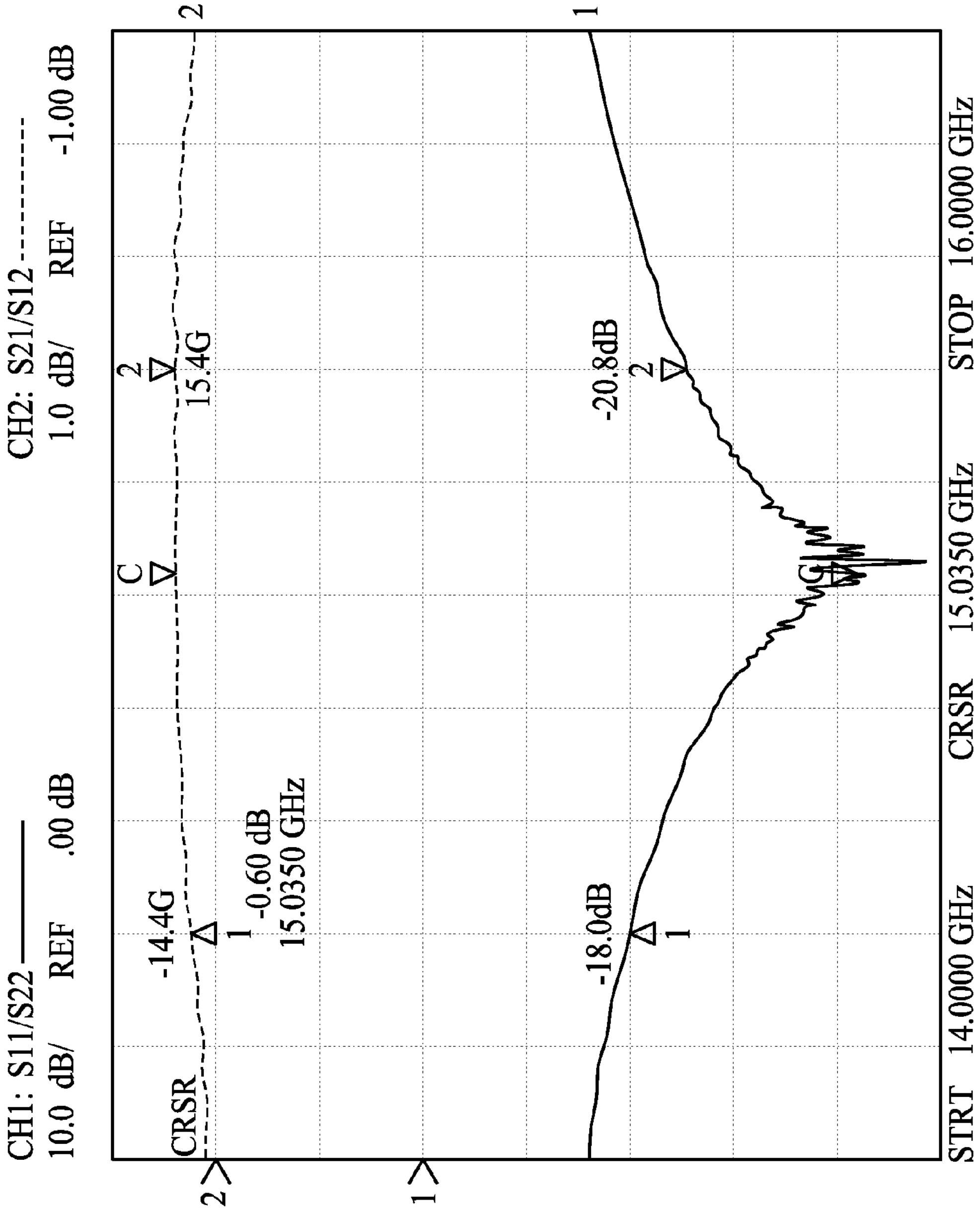
FIG. 6 is a measured frequency response diagram of the multi-layer circuit board in FIG. 1.

FIG. 5 is a simulated frequency response diagram of the multi-layer circuit board 10 with a waveguide to microstrip transition structure, as shown in FIG. 1, and FIG. 6 is a measured frequency response diagram of the multi-layer circuit board 10, as shown in FIG. 1, in which the transverse axis represents the frequency and the longitudinal axis represents the insertion loss (solid line) or return loss (dotted line). Comparing FIG. 5 and FIG. 6, it is clear that the simulated frequency response diagram is substantially the same as that of the measured frequency response diagram. As shown in FIG. 5 and FIG. 6, according to some embodiments of the present disclosure, the center frequency of the multi-layer circuit board 10 is designed to be about 15.0 GHz, wherein the return loss is optimized and the insertion loss is very low, at about 0.4 dB.

Figure 7:
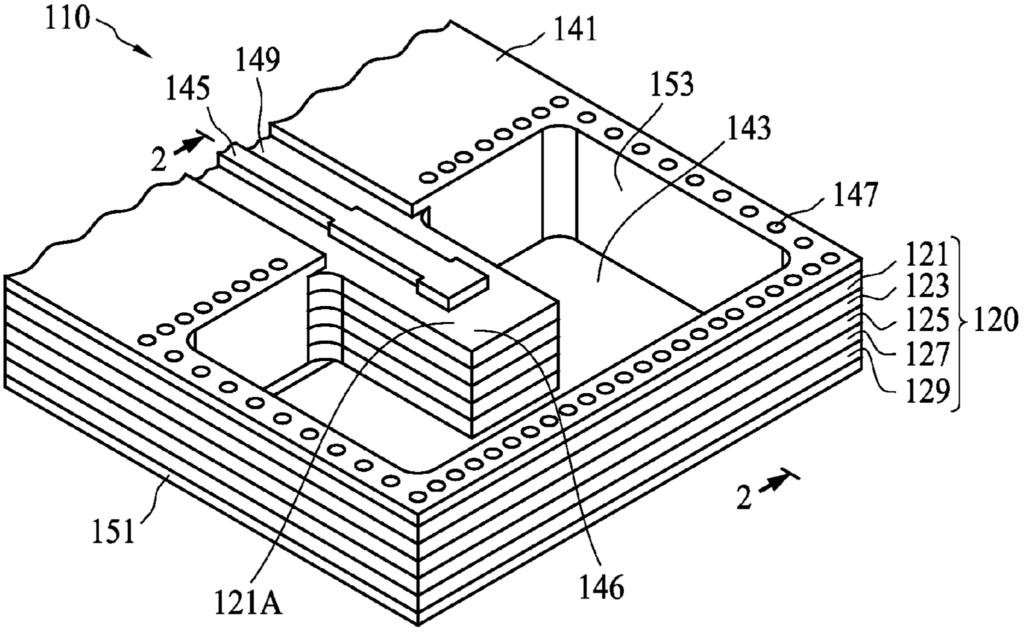
FIG. 7 is a top full view of a multi-layer circuit board with a waveguide to microstrip transition structure according to some embodiments of the present disclosure.
Figure 8:
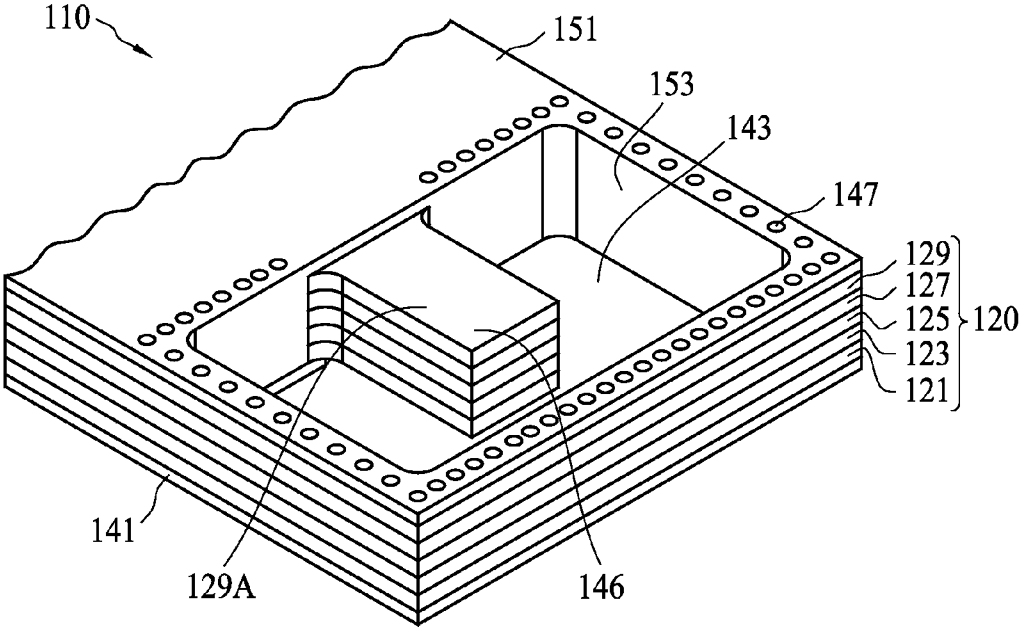
FIG. 8 is a bottom full view of the multi-layer circuit board in FIG. 7.

FIG. 7 is a top full view of a multi-layer circuit board 110 with a waveguide to microstrip transition structure according to some embodiments of the present disclosure, and FIG. 8 is a bottom full view of the multi-layer circuit board 110 in FIG. 7. In some embodiments of the present disclosure, the multi-layer circuit board 110 comprises a laminated structure 120 including a plurality of dielectric layers 121-129, a top metal frame 141 disposed over the laminated structure 120, a microstrip line 145 disposed over the laminated structure 120, a bottom metal frame 151 underlying the laminated structure 120, and a plurality of conductors 147 electrically connecting the top metal frame 141 and the bottom metal frame 151. In an exemplary embodiment of the present disclosure, the conductors 147 are conductive through holes which are either plated or filled with conductive material such as copper or copper alloy; in addition, other conductive material can also be used to form the conductors 147.

In some embodiments of the present disclosure, the laminated structure 120 has a waveguide cavity 143 and a protrusion 146 extending into the waveguide cavity 143, and the waveguide cavity 143 penetrates through the laminated structure 120. In some embodiments of the present disclosure, the microstrip line 145 is disposed over the protrusion 146 and extends into the waveguide cavity 143. In some embodiments of the present disclosure, the top metal frame 141 has a passage gap 149, and the microstrip line 145 extends into the top cavity 143 through the passage gap 149.

In some embodiments of the present disclosure, the sidewalls of the waveguide cavity 143 are plated with a conductive plating 153; further, the sidewalls of the protrusion 146 are not plated with conductive material, and the corners between the sidewall of the waveguide cavity 143 and the sidewall of the protrusion 146 are not plated with conductive material. In an exemplary embodiment of the present disclosure, the conductive plating 153 may be formed of copper or copper alloy; in addition, other conductive material can also be used to form the conductive plating 153.

In an exemplary embodiment of the present disclosure, the top metal frame 141 and the bottom metal frame 151 may be formed of copper or copper alloy; in addition, other conductive material can also be used to form the top metal frame 141 and the bottom metal frame 151. In an exemplary embodiment of the present disclosure, the top metal frame 141 and the bottom metal frame 151 may have a thickness of 17.5 micrometers, which is commonly referred to as 0.5 oz copper.

In some embodiments of the present disclosure, the laminated structure 120 includes an upper dielectric layer 121 and a lower dielectric layer 129, wherein the upper dielectric layer 121 has a first dissipation factor, the lower dielectric layer 129 has a second dissipation factor, and the first dissipation factor is smaller than the second dissipation factor. For example, the upper dielectric layer 121 may use an RO4003C™ dielectric having a dissipation factor of 0.0027, which is commercially available from Rogers Corporation, or a TLY-5 dielectric having a dissipation factor of 0.0009, which is commercially available from Taconic International, Ltd, and the lower dielectric layer 129 may use epoxy-glass composite (FR4) material having a dissipation factor of 0.017. In a preferred embodiment of the present disclosure, the upper dielectric layer 21 is implemented by the RO4003C™ dielectric, and is considered inexpensive as compared to the TLY-5 dielectric.

In some embodiments of the present disclosure, the waveguide cavity 143 exposes a top surface 121A of the upper dielectric layer 121 of the protrusion 146 and a bottom surface 129A of the lower dielectric layer 129 of the protrusion 146. In an exemplary embodiment of the present disclosure, the upper dielectric layer 121 can be implemented by a sheet of an RO4003C™ dielectric having a thickness of 8.0 mil, and the lower dielectric layers 123-129 can be implemented by sheets of epoxy-glass composite (FR4) material having thicknesses from 4.7 mil to 8.0 mil.

Figure 9:
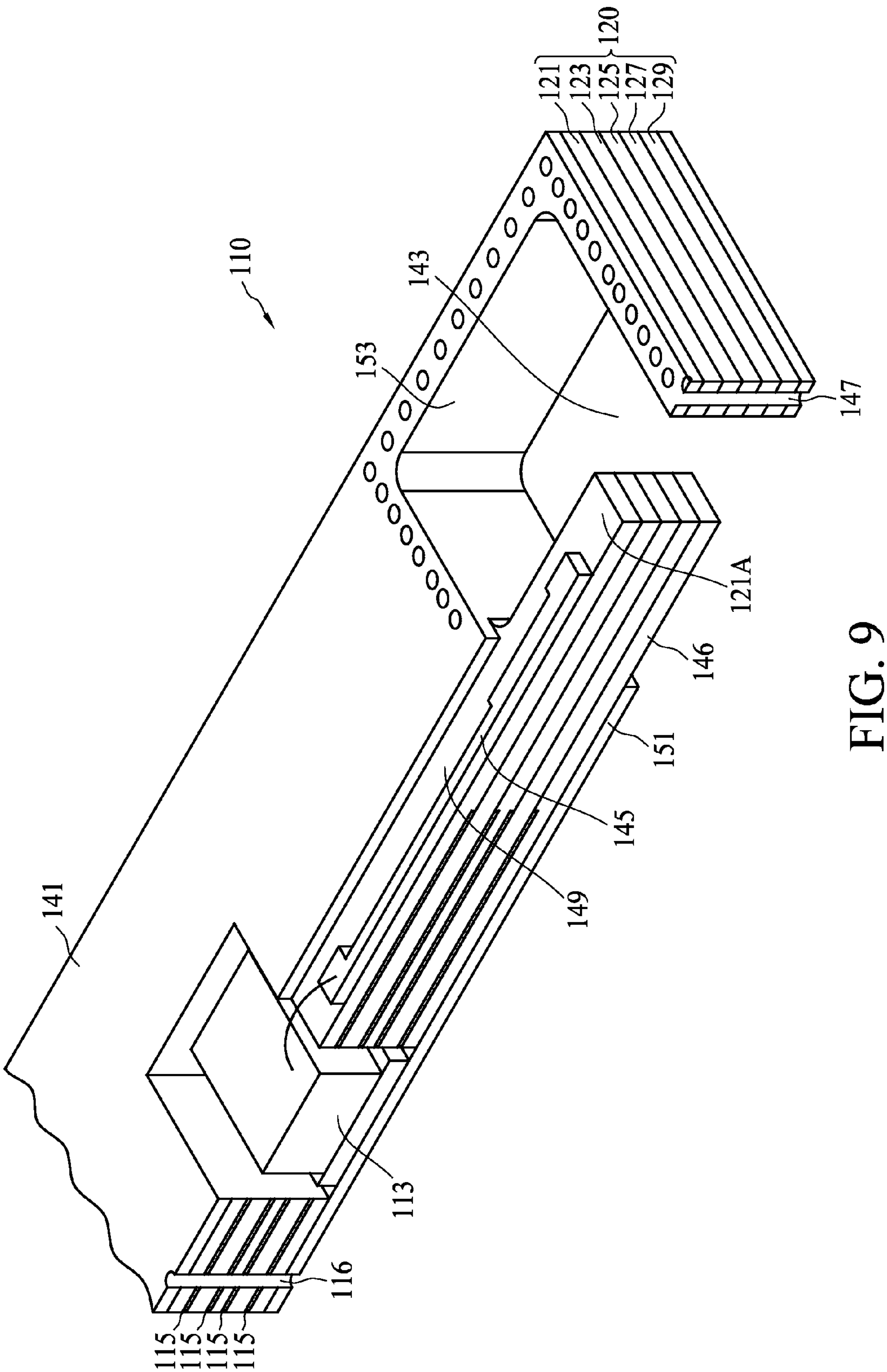
FIG. 9 is a distant cross-sectional view of the multi-layer circuit board along the cross-sectional line 2-2 in FIG. 7.

FIG. 9 is a distant cross-sectional view of the multi-layer circuit board 110 along the cross-sectional line 2-2 in FIG. 7, showing the other portion of the multi-layer circuit board 110. In some embodiments of the present disclosure, the multi-layer circuit board 110 further comprises a plurality of metal layers 115 each disposed between two of the plurality of dielectric layers 121-129. In an exemplary embodiment of the present disclosure, the metal layers 115 are electrically connected through conductive members 116 such as conductive through holes which are either plated or filled with conductive material.

In some embodiments of the present disclosure, the multi-layer circuit board 110 further comprises an electronic device 113 electrically connected to the microstrip line 145 or at least one of the metal layers 115. In an exemplary embodiment of the present disclosure, the electronic device 113 is an RF signal processing circuit, a power amplifier, or a filter. In addition, the electronic device 113 may electrically connect to another device (not shown in the drawings) disposed on the multi-layer circuit board 110 through the metal layers 115 and the conductive members 116. In an exemplary embodiment of the present disclosure, the metal layers 115 may have a thickness of 17.5 micrometers (commonly referred to as 0.5 oz copper) or a thickness of 35.0 micrometers (commonly referred to as 1.0 oz copper).

Figure 10:
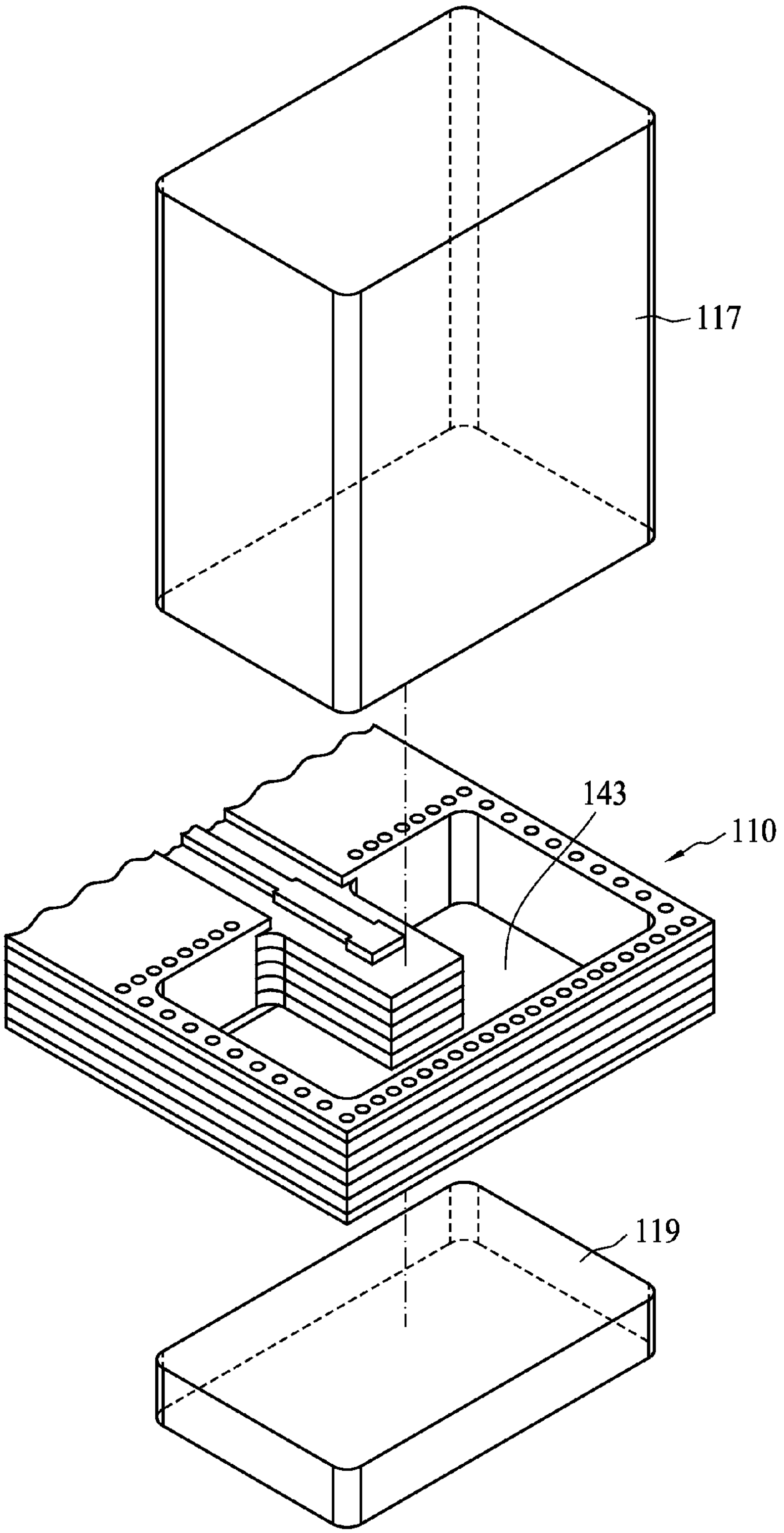
FIG. 10 is an exploded view of the multi-layer circuit board in FIG. 7 with other components.

FIG. 10 is an exploded view of the multi-layer circuit board 110 in FIG. 7 with other components. In some embodiments of the present disclosure, the multi-layer circuit board 110 may be assembled with a waveguide 117 coupled to the top of the waveguide cavity 143 and a wave reflector 119 coupled to the bottom of the waveguide cavity 143. In an exemplary embodiment of the present disclosure, the waveguide 117 may use a WR-42 waveguide.

Figure 11:
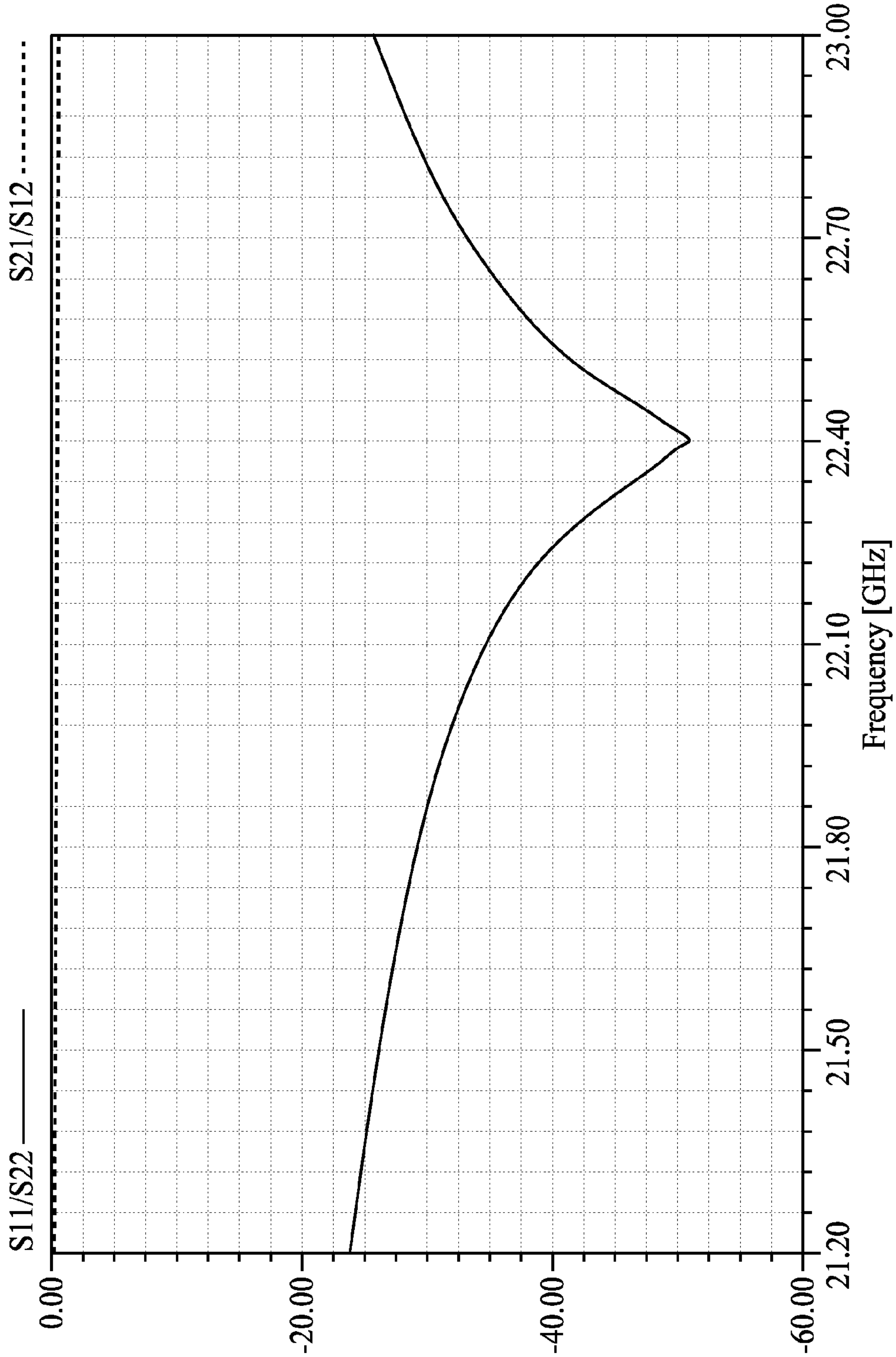
FIG. 11 is a simulated frequency response diagram of the multi-layer circuit board with a waveguide to microstrip transition structure in FIG. 7.
Figure 12:
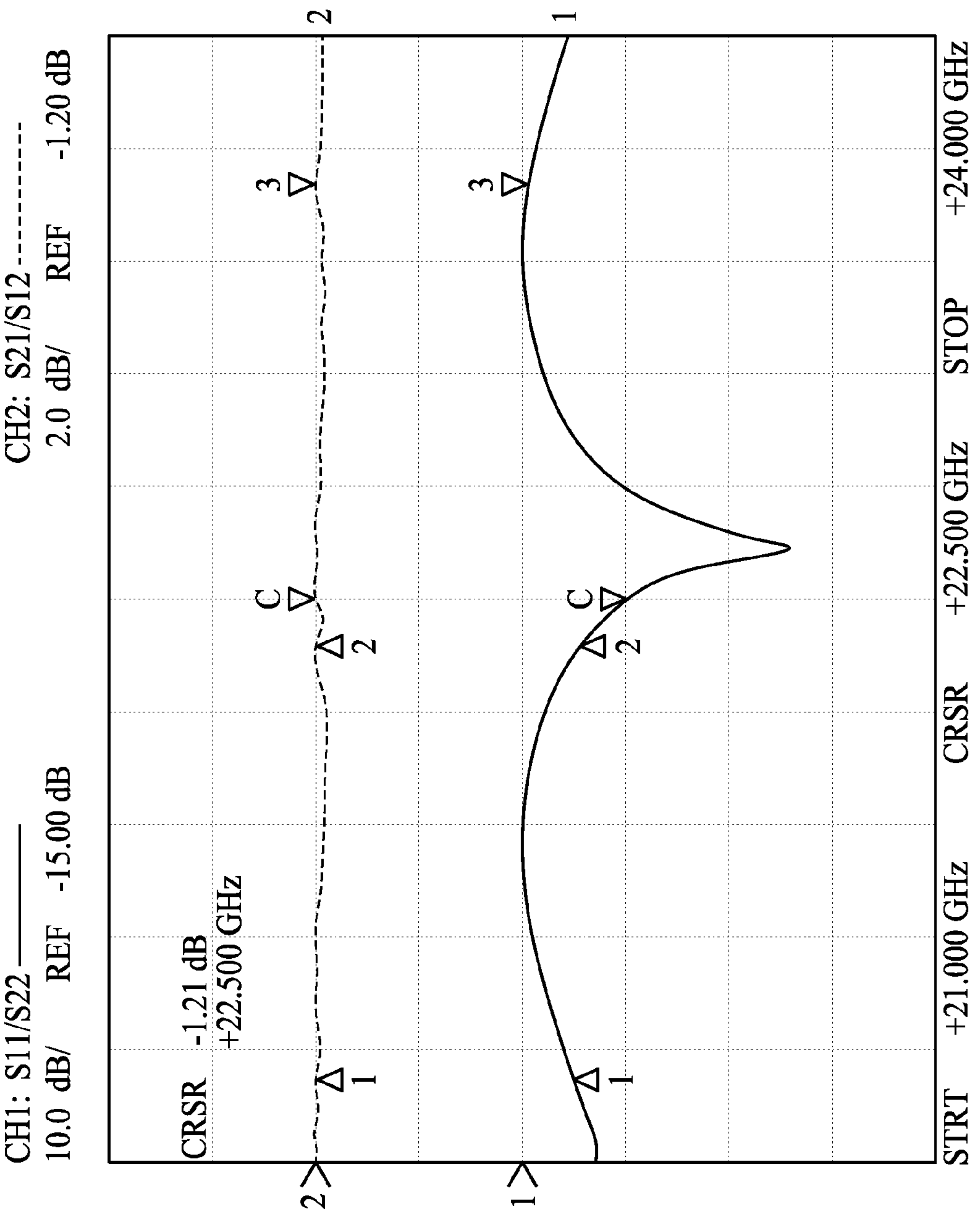
FIG. 12 is a measured frequency response diagram of the multi-layer circuit board, as shown in FIG. 7.

FIG. 11 is a simulated frequency response diagram of the multi-layer circuit board 110 with a waveguide to microstrip transition structure, as shown in FIG. 7, and FIG. 12 is a measured frequency response diagram of the multi-layer circuit board 110, as shown in FIG. 7, in which the transverse axis represents the frequency and the longitudinal axis represents the insertion loss (solid line) or return loss (dotted line). Comparing FIG. 11 and FIG. 12, it is clear that the simulated frequency response diagram is substantially the same as that of the measured frequency response diagram. As shown in FIG. 11 and FIG. 12, according to some embodiments of the present disclosure, the center frequency of the multi-layer circuit board 110 is designed to be about 22.5 GHz, wherein the return loss is optimized and the insertion loss is very low, at about 1.0 dB.

Figure 13:
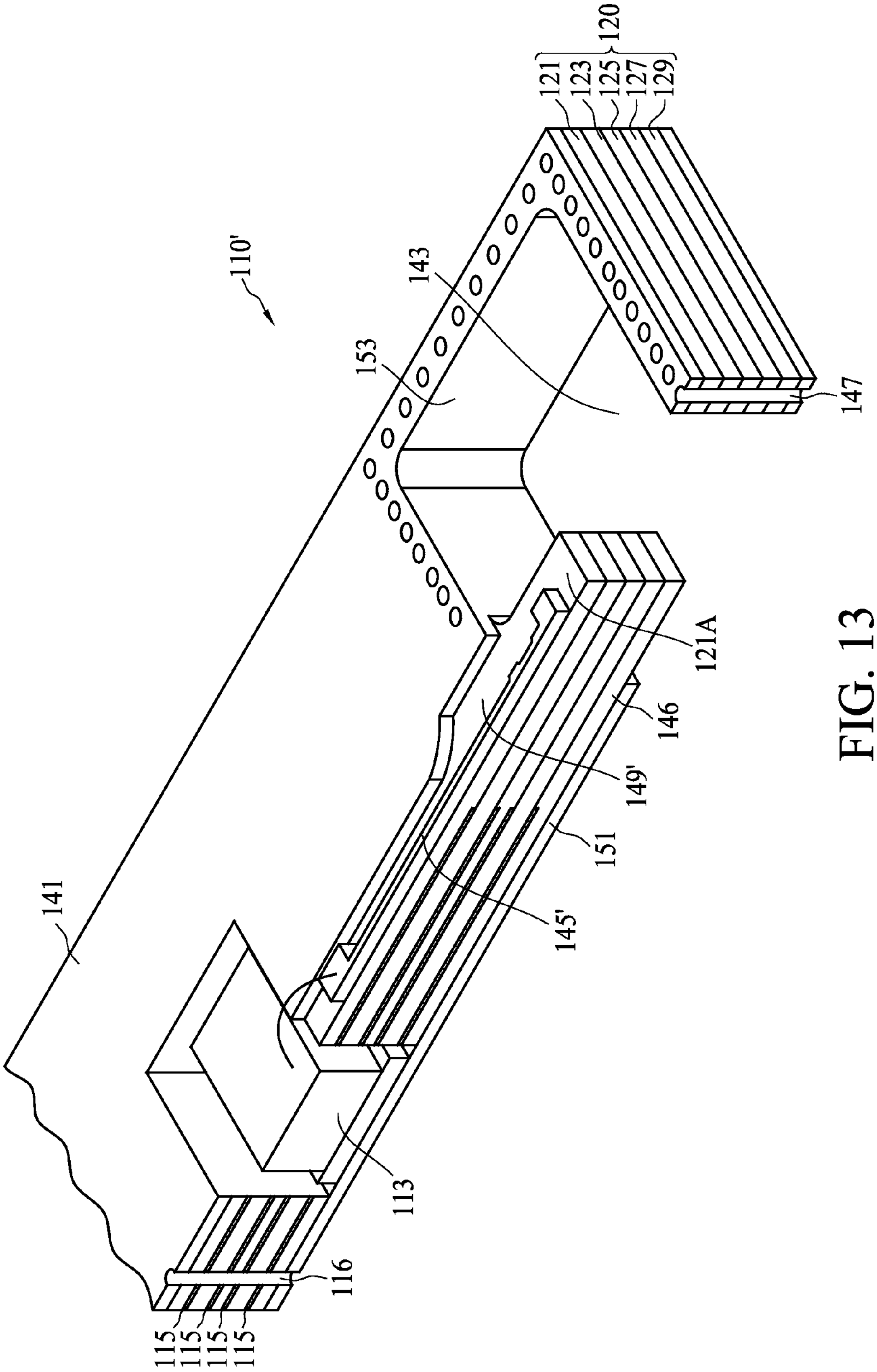
FIG. 13 is a distant cross-sectional view of the multi-layer circuit board according to some embodiments of the present disclosure.

FIG. 13 is a distant cross-sectional view of the multi-layer circuit board 110' according to some embodiments of the present disclosure. Comparing the multi-layer circuit board 110' in FIG. 13 and the multi-layer circuit board 110 in FIG. 9, it is clear that the shape of the microstrip line 145' in FIG. 11 is different from that of the microstrip line 145 in FIG. 9, and the shape of the passage gap 149' in FIG. 11 is different from that of the passage gap 149 in FIG. 9.

Figure 14:
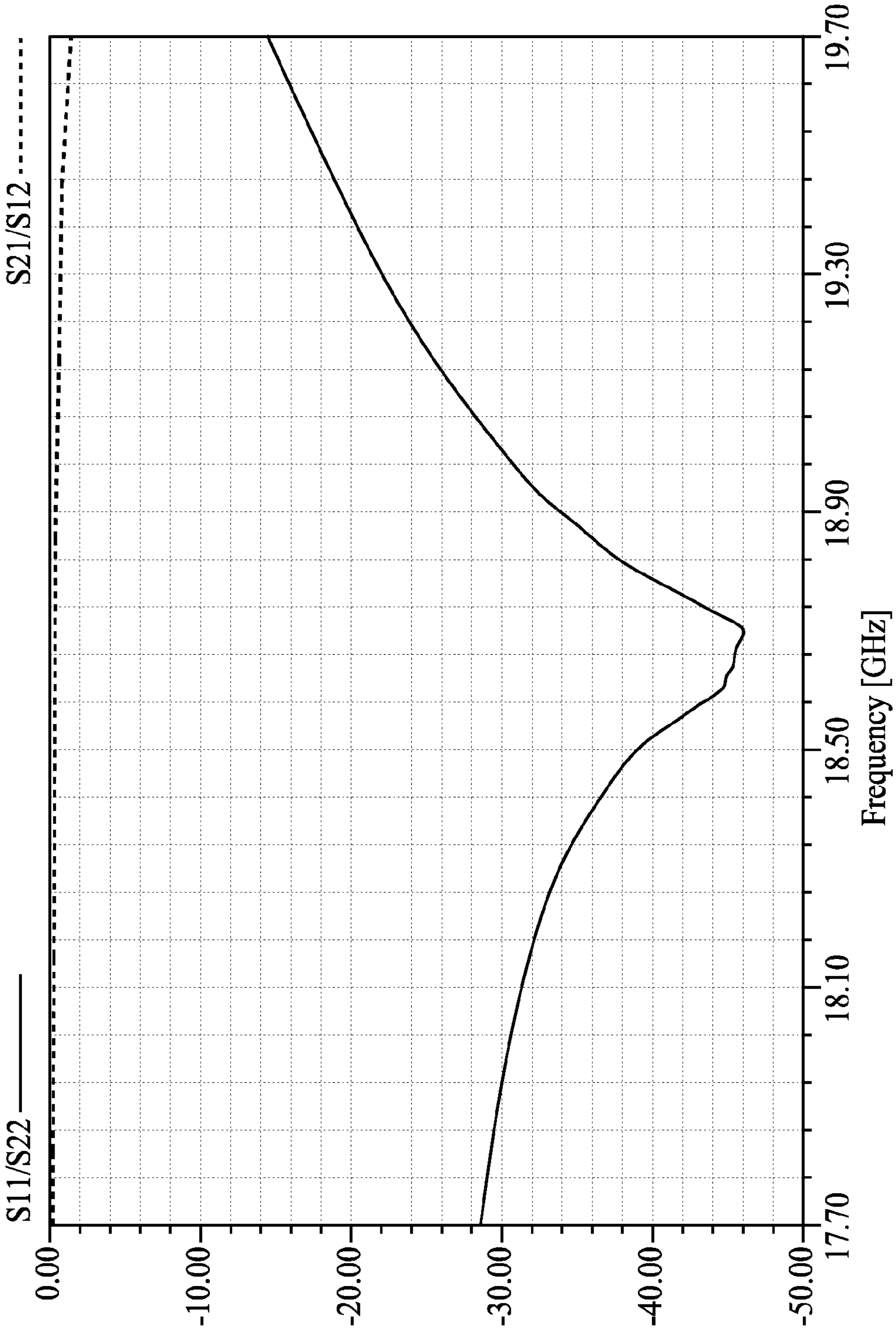
FIG. 14 is a simulated frequency response diagram of the multi-layer circuit board with a waveguide to microstrip transition structure in FIG. 13.
Figure 15:
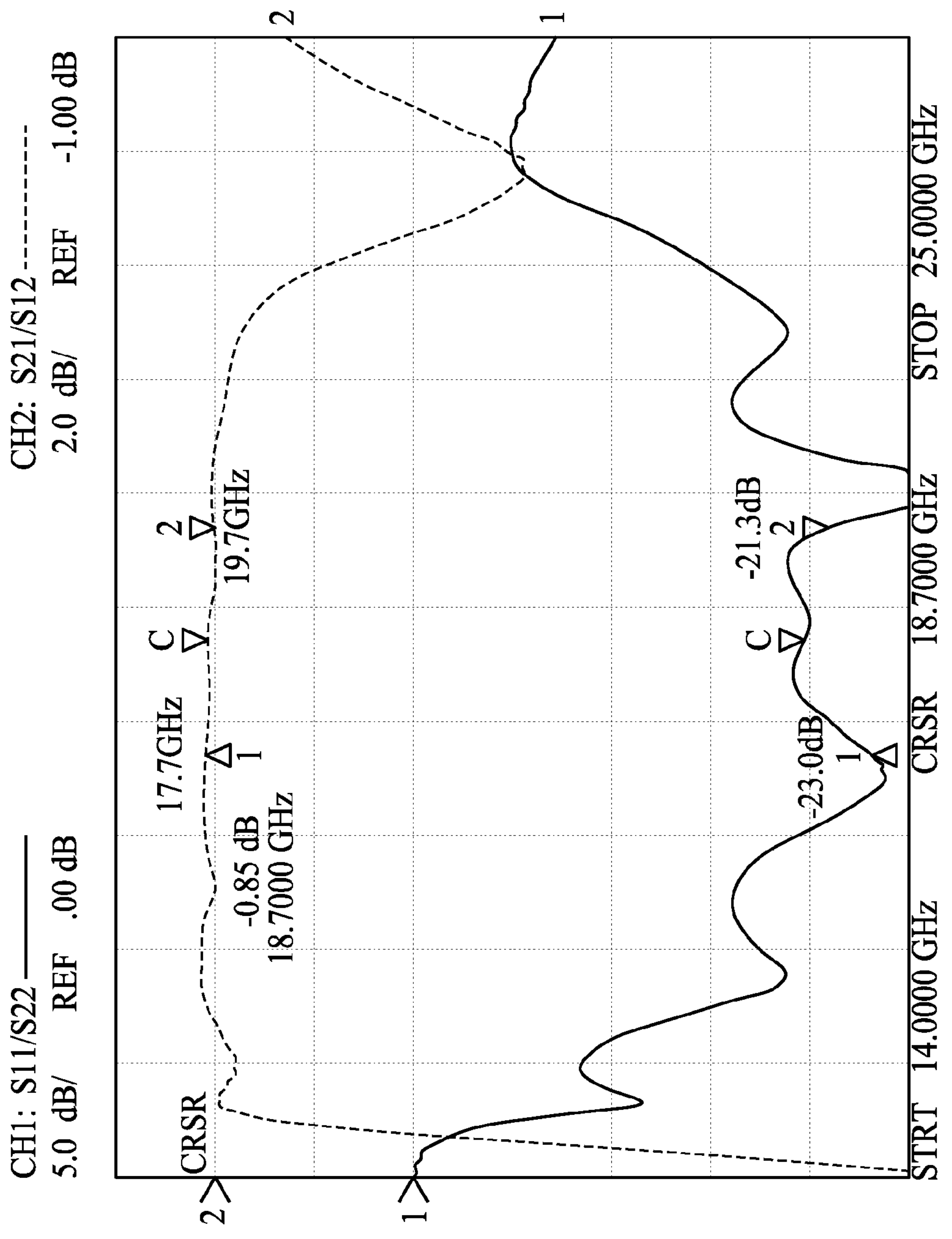
FIG. 15 is a measured frequency response diagram of the multi-layer circuit board in FIG. 13.

FIG. 14 is a simulated frequency response diagram of the multi-layer circuit board 110' with a waveguide to microstrip transition structure, as shown in FIG. 13, and FIG. 15 is a measured frequency response diagram of the multi-layer circuit board 110', as shown in FIG. 13, in which the transverse axis represents the frequency and the longitudinal axis represents the insertion loss (solid line) or return loss (dotted line). Comparing FIG. 14 and FIG. 15, it is clear that the simulated frequency response diagram is substantially the same as that of the measured frequency response diagram. As shown in FIG. 14 and FIG. 15, according to some embodiments of the present disclosure, the center frequency of the multi-layer circuit board 110' is designed to be about 18.0 GHz, wherein the return loss is optimized and the insertion loss is very low, at about 0.6 dB.

The structure of the multi-layer circuit board 110' is substantially the same as that of the multi-layer circuit board 110, except for the shape of the microstrip line and the shape of the passage gap. In other words, the structure design of the present disclosure can be used to design the multi-layer circuit board with a waveguide to microstrip transition structure for different frequency application by changing the shape of the microstrip line and the shape of the passage gap.

Figure 16:
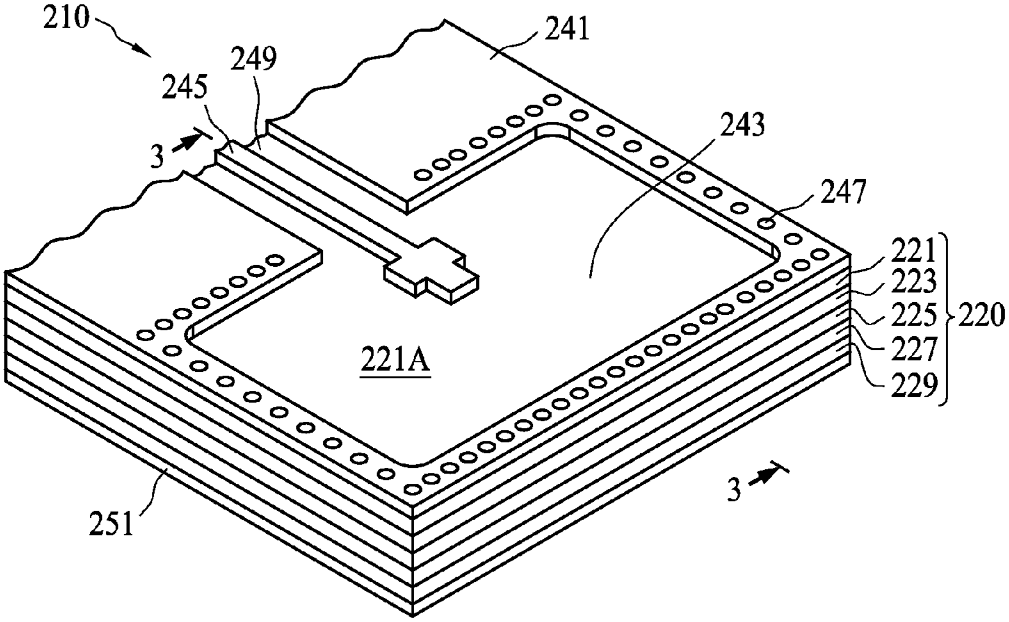
FIG. 16 is a top full view of a multi-layer circuit board with a waveguide to microstrip transition structure according to some embodiments of the present disclosure.
Figure 17:
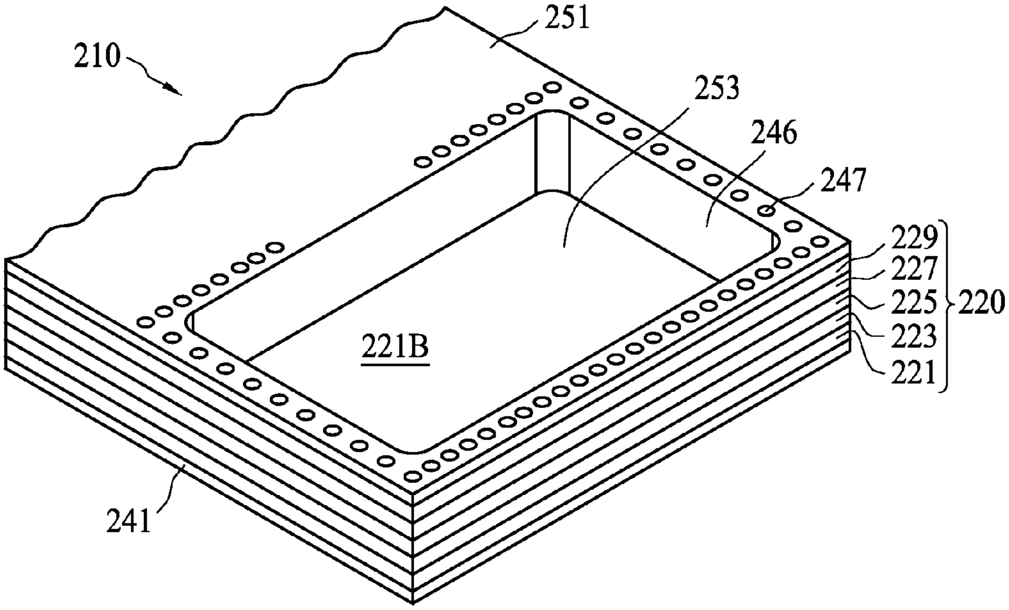
FIG. 17 is a bottom full view of the multi-layer circuit board in FIG. 16.

FIG. 16 is a top full view of a multi-layer circuit board 210 with a waveguide to microstrip transition structure according to some embodiments of the present disclosure, and FIG. 17 is a bottom full view of the multi-layer circuit board 210 in FIG. 16. In some embodiments of the present disclosure, the multi-layer circuit board 210 comprises a laminated structure 220 including a plurality of dielectric layers 221-229, a top metal frame 241 disposed over the laminated structure 220, a microstrip line 245 disposed over the laminated structure 220, a bottom metal frame 251 underlying the laminated structure 220, and a plurality of conductors 247 electrically connecting the top metal frame 241 and the bottom metal frame 251. In an exemplary embodiment of the present disclosure, the conductors 247 are conductive through holes which are either plated or filled with conductive material such as copper or copper alloy; in addition, other conductive material can also be used to form the conductors 247.

In some embodiments of the present disclosure, the top metal frame 241 defines a top cavity 243, the bottom metal frame 251 defines a bottom cavity 253 corresponding to the top cavity 243, and the microstrip line 245 extends into the top cavity 243. In some embodiments of the present disclosure, the top metal frame 241 has a passage gap 249, and the microstrip line 245 extends into the top cavity 243 through the passage gap 249. In some embodiments of the present disclosure, the conductors 247 are conductive through holes which are either plated or filled with conductive material such as copper or copper alloy; in addition, other conductive material can also be used to form the conductors 247. In some embodiments of the present disclosure, the sidewalls of the bottom cavity 253 are plated with a conductive plating 246. In an exemplary embodiment of the present disclosure, the conductive plating 246 may be formed of copper or copper alloy; in addition, other conductive material can also be used to form the conductive plating 246.

In an exemplary embodiment of the present disclosure, the top metal frame 241 and the bottom metal frame 251 may be formed of copper or copper alloy; in addition, other conductive material can also be used to form the top metal frame 241 and the bottom metal frame 251. In an exemplary embodiment of the present disclosure, the top metal frame 241 and the bottom metal frame 251 may have a thickness of 17.5 micrometers, which is commonly referred to as 0.5 oz copper.

In some embodiments of the present disclosure, the laminated structure 220 includes an upper dielectric layer 221 and a lower dielectric layer 229, wherein the upper dielectric layer 221 has a first dissipation factor, the lower dielectric layer 229 has a second dissipation factor, and the first dissipation factor is smaller than the second dissipation factor. For example, the upper dielectric layer 221 may use a TLY-5 dielectric having a dissipation factor of 0.0009, which is commercially available from Taconic International, Ltd, and the lower dielectric layer 229 may use epoxy-glass composite (FR4) material having a dissipation factor of 0.017.

In some embodiments of the present disclosure, the top cavity 243 exposes a top surface 221A of the upper dielectric layer 221, and the bottom cavity 253 exposes a bottom surface 221B of the upper dielectric layer 221. In an exemplary embodiment of the present disclosure, the upper dielectric layer 221 can be implemented by a sheet of a TLY-5 dielectric having a thickness of 10.0 mil, and the lower dielectric layers 223-229 can be implemented by sheets of epoxy-glass composite (FR4) material having thicknesses from 4.7 mil to 8.0 mil.

Figure 18:
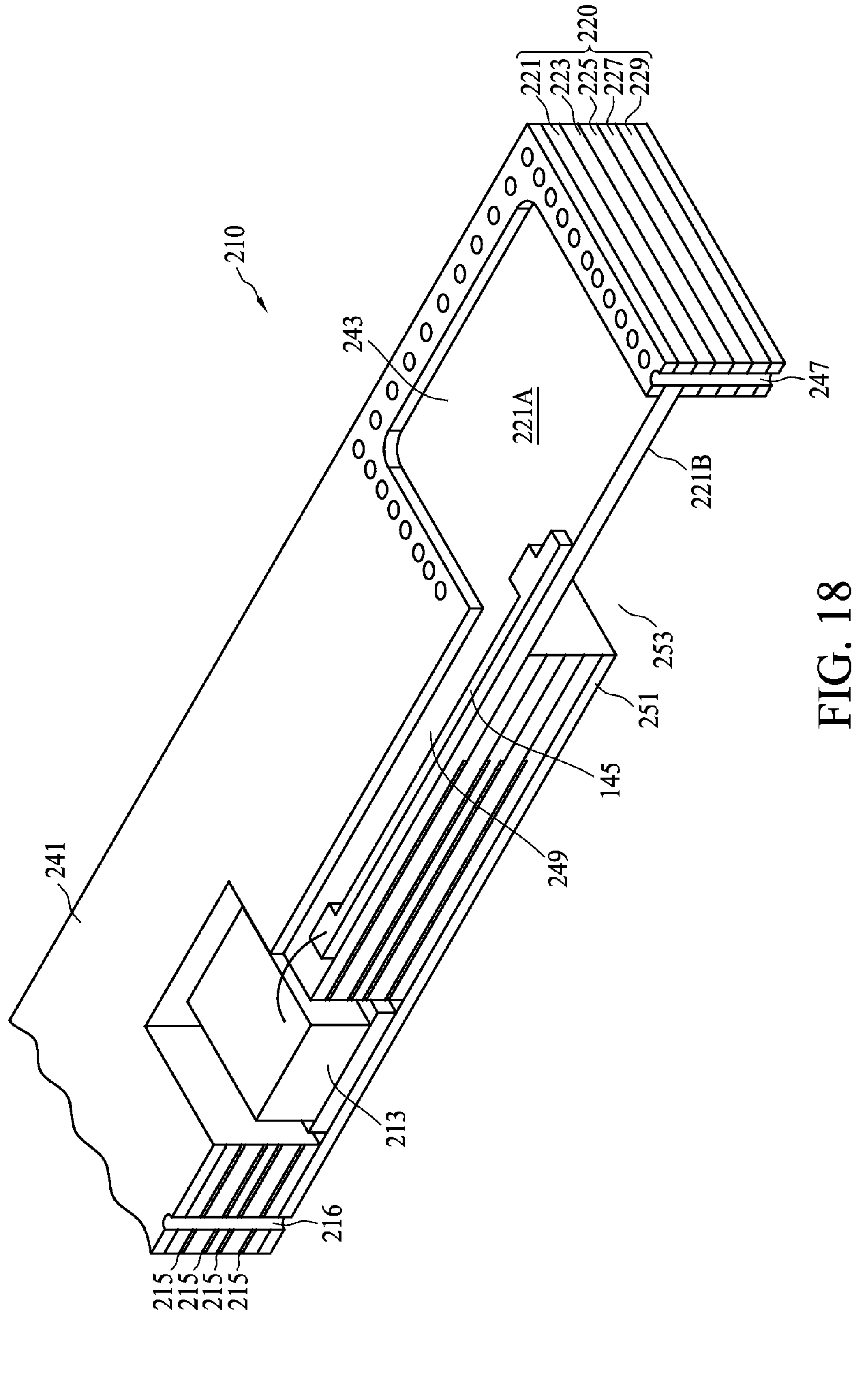
FIG. 18 is a distant cross-sectional view of the multi-layer circuit board along the cross-sectional line 3-3 in FIG. 16.

FIG. 18 is a distant cross-sectional view of the multi-layer circuit board 210 along the cross-sectional line 3-3 in FIG. 16, showing the other portion of the multi-layer circuit board 210. In some embodiments of the present disclosure, the multi-layer circuit board 210 further comprises a plurality of metal layers 215 each disposed between two of the plurality of dielectric layers 221-229. In an exemplary embodiment of the present disclosure, the metal layers 215 are electrically connected through conductive members 216 such as conductive through holes which are either plated or filled with conductive material.

In some embodiments of the present disclosure, the multi-layer circuit board 210 further comprises an electronic device 213 electrically connected to the microstrip line 245 or one of the metal layers 215. In an exemplary embodiment of the present disclosure, the electronic device 213 is an RF signal processing circuit, a power amplifier, or a filter. In addition, the electronic device 213 may electrically connect to another device (not shown in the drawings) disposed on the multi-layer circuit board 210 through the metal layers 215 and the conductive members 216. In an exemplary embodiment of the present disclosure, the metal layers 215 may have a thickness of 17.5 micrometers (commonly referred to as 0.5 oz copper) or a thickness of 35.0 micrometers (commonly referred to as 1.0 oz copper).

Figure 19:
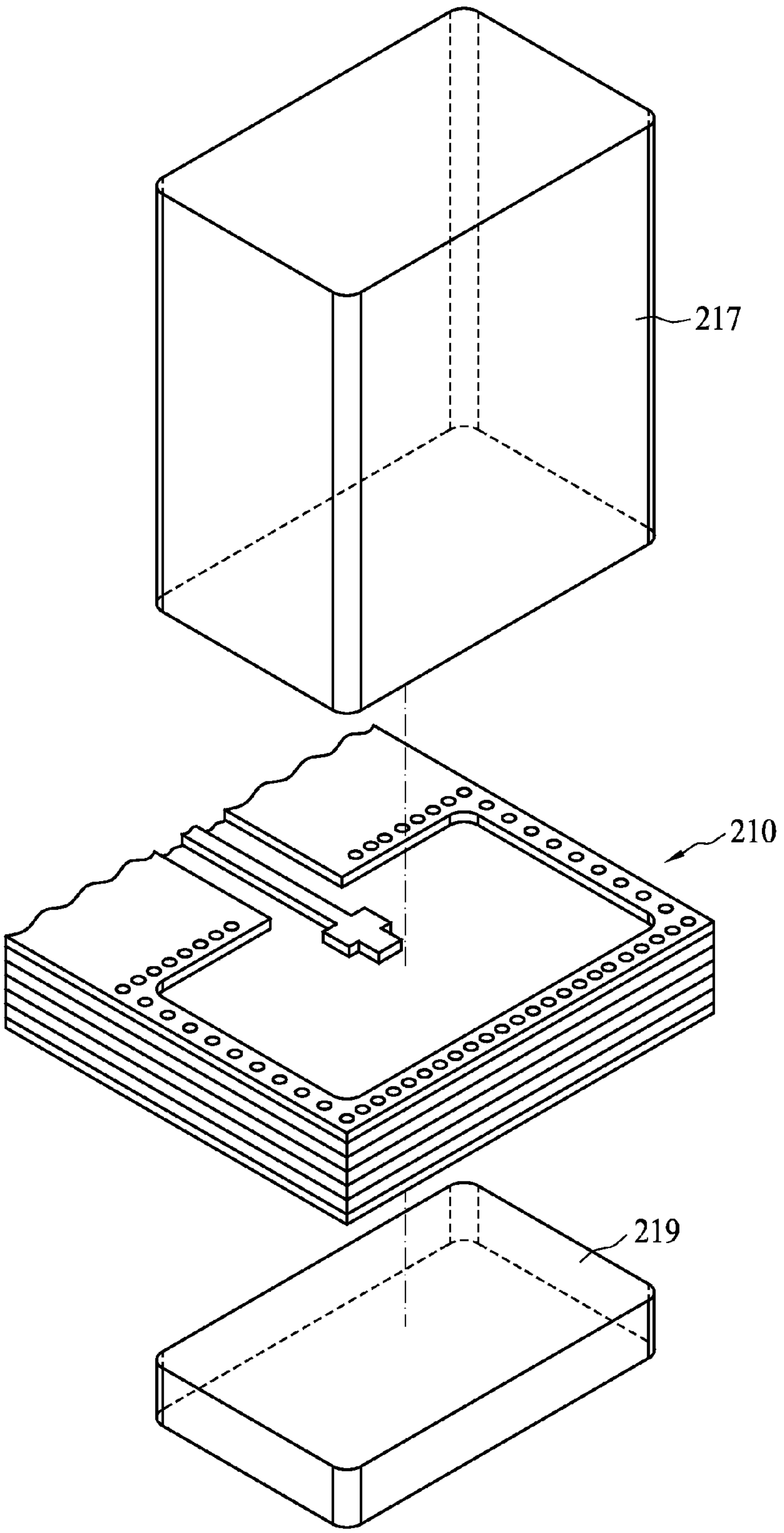
FIG. 19 is an exploded view of the multi-layer circuit board in FIG. 16 with other components.

FIG. 19 is an exploded view of the multi-layer circuit board 210 in FIG. 16 with other components. In some embodiments of the present disclosure, the multi-layer circuit board 210 may be assembled with a waveguide 217 coupled to the top cavity 243 and a wave reflector 219 coupled to the bottom cavity 253. In an exemplary embodiment of the present disclosure, the waveguide 127 may use a WR-28 waveguide.

Figure 20:
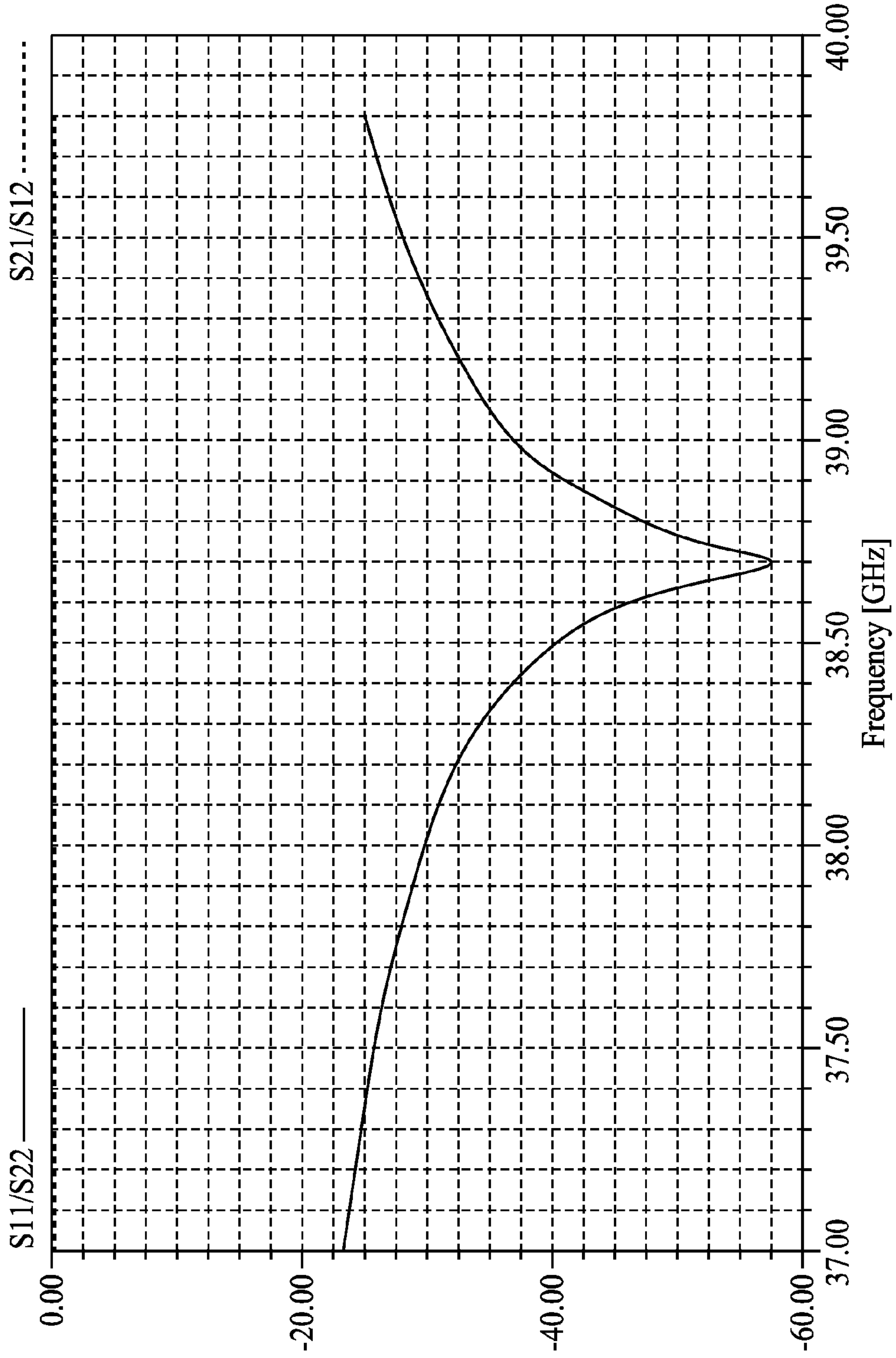
FIG. 20 is a simulated frequency response diagram of the multi-layer circuit board with a waveguide to microstrip transition structure, as shown in FIG. 16.
Figure 21:
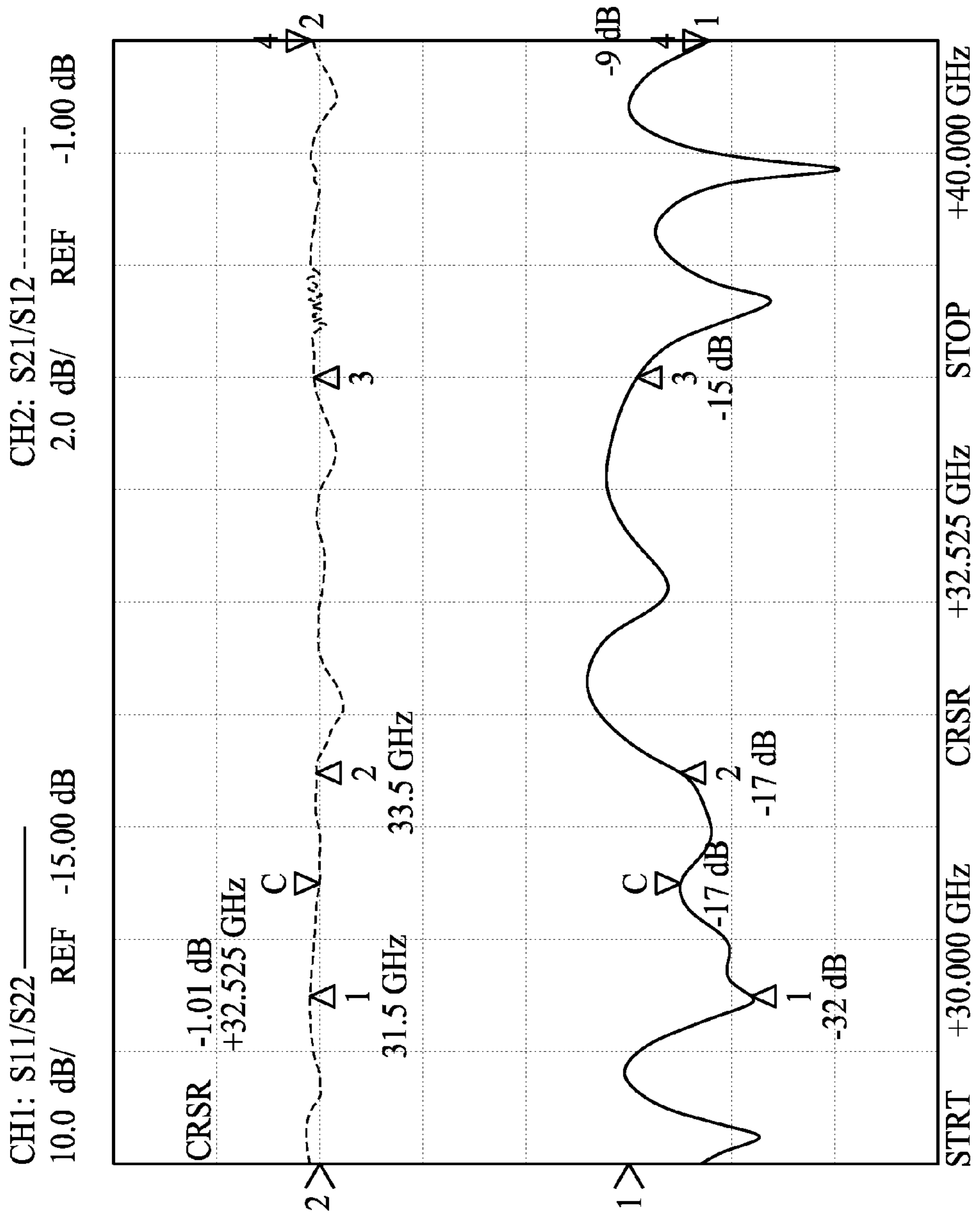
FIG. 21 is a measured frequency response diagram of the multi-layer circuit board in FIG. 16.

FIG. 20 is a simulated frequency response diagram of the multi-layer circuit board 210 with a waveguide to microstrip transition structure, as shown in FIG. 16, and FIG. 21 is a measured frequency response diagram of the multi-layer circuit board 210, as shown in FIG. 16, in which the transverse axis represents the frequency and the longitudinal axis represents the insertion loss (solid line) or return loss (dotted line). Comparing FIG. 20 and FIG. 21, it is clear that the simulated frequency response diagram is substantially the same as that of the measured frequency response diagram. As shown in FIG. 20 and FIG. 21, according to some embodiments of the present disclosure, the center frequency of the multi-layer circuit board 210 is designed to be about 38.75 GHz, wherein the return loss is optimized and the insertion loss is very low, at about 0.3 dB.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A multi-layer circuit board with a waveguide to microstrip transition structure, comprising:

a laminated structure including a plurality of dielectric layers;

a top metal frame disposed over the laminated structure, wherein the top metal frame defines a top cavity;

a microstrip line disposed over the laminated structure and extending into the top cavity;

a bottom metal frame underlying the laminated structure, wherein the bottom metal frame defines a bottom cavity corresponding to the top cavity; and a plurality of conductors electrically connecting the top metal frame and the bottom metal frame;

wherein the laminated structure includes an upper dielectric layer and at least one lower dielectric layer, the top cavity exposes a top surface of the upper dielectric layer, and the bottom cavity exposes a bottom surface of the at least one lower dielectric layer.

2. The multi-layer circuit board with a waveguide to microstrip transition structure of claim 1, wherein the upper dielectric layer has a first dissipation factor, the at least one lower dielectric layer has a second dissipation factor, and the first dissipation factor is smaller than the second dissipation factor.

3. The multi-layer circuit board with a waveguide to microstrip transition structure of claim 1, wherein the top metal frame has a passage gap, and the microstrip line extends into the top cavity through the passage gap.

4. The multi-layer circuit board with a waveguide to microstrip transition structure of claim 1, further comprising an electronic device electrically connected to the microstrip line.

5. The multi-layer circuit board with a waveguide to microstrip transition structure of claim 1, further comprising a plurality of metal layers disposed between two of the plurality of dielectric layers.

6. A multi-layer circuit board with a waveguide to microstrip transition structure, comprising:

a laminated structure including a plurality of dielectric layers, wherein the laminated structure has a waveguide cavity and a protrusion extending into the waveguide cavity, and the waveguide cavity penetrates through the laminated structure;

a top metal frame disposed over the laminated structure;

a microstrip line disposed over the laminated structure and extending into the waveguide cavity;

a bottom metal frame underlying the laminated structure; and a plurality of conductors electrically connecting the top metal frame and the bottom metal frame;

wherein the laminated structure includes an upper dielectric layer and at least one lower dielectric layer, and the waveguide cavity exposes a top surface of the upper dielectric layer of the protrusion and a bottom surface of the at least one lower dielectric layer of the protrusion.

7. The multi-layer circuit board with a waveguide to microstrip transition structure of claim 6, wherein the laminated structure includes an upper dielectric layer having a first dissipation factor, at least one lower dielectric layer having a second dissipation factor, and the first dissipation factor is smaller than the second dissipation factor.

8. The multi-layer circuit board with a waveguide to microstrip transition structure of claim 6, wherein the top metal frame has a passage gap, and the microstrip line extends into the waveguide cavity through the passage gap.

9. The multi-layer circuit board with a waveguide to microstrip transition structure of claim 6, further comprising an electronic device electrically connected to the microstrip line.

10. The multi-layer circuit board with a waveguide to microstrip transition structure of claim 6, further comprising a plurality of metal layers disposed between two of the plurality of dielectric layers.

11. The multi-layer circuit board with a waveguide to microstrip transition structure of claim 6, further comprising a conductive plating disposed on sidewalls of the waveguide cavity.

12. The multi-layer circuit board with a waveguide to microstrip transition structure of claim 11, wherein sidewalls of the protrusion are not plated with the conductive plating.

13. The multi-layer circuit board with a waveguide to microstrip transition structure of claim 11, wherein corners between the sidewall of the waveguide cavity and the sidewall of the protrusion are not plated with conductive plating.

14. A multi-layer circuit board with a waveguide to microstrip transition structure, comprising:

a laminated structure including a plurality of dielectric layers;

a top metal frame disposed over the laminated structure, wherein the top metal frame defines a top cavity;

a microstrip line disposed over the laminated structure and extending into the top cavity;

a bottom metal frame underlying the laminated structure, wherein the bottom metal frame defines a bottom cavity corresponding to the top cavity; and a plurality of conductors electrically connecting the top metal frame and the bottom metal frame;

wherein the laminated structure includes an upper dielectric layer and at least one lower dielectric layer, and the bottom cavity extends into the at least one lower dielectric layer and exposes a bottom surface of the upper dielectric layer.

15. The multi-layer circuit board with a waveguide to microstrip transition structure of claim 14, wherein the upper dielectric layer has a first dissipation factor, the at least one lower dielectric layer has a second dissipation factor, and the first dissipation factor is smaller than the second dissipation factor.

16. The multi-layer circuit board with a waveguide to microstrip transition structure of claim 14, wherein the top metal frame has a passage gap, and the microstrip line extends into the top cavity through the passage gap.

17. The multi-layer circuit board with a waveguide to microstrip transition structure of claim 14, further comprising an electronic device electrically connected to the microstrip line.

18. The multi-layer circuit board with a waveguide to microstrip transition structure of claim 14, further comprising a plurality of metal layers disposed between two of the plurality of dielectric layers.

19. The multi-layer circuit board with a waveguide to microstrip transition structure of claim 14, further comprising a conductive plating disposed on sidewalls of the bottom cavity.

* * * * *